US007265589B2

(12) United States Patent
Chuang et al.

(10) Patent No.: US 7,265,589 B2
(45) Date of Patent: Sep. 4, 2007

(54) INDEPENDENT GATE CONTROL LOGIC CIRCUITRY

(75) Inventors: Ching-Te Chuang, South Salem, NY (US); Keunwoo Kim, Somers, NY (US); Jente Benedict Kuang, Austin, TX (US); Kevin John Nowka, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 179 days.

(21) Appl. No.: 11/168,717

(22) Filed: Jun. 28, 2005

(65) Prior Publication Data

US 2006/0290384 A1    Dec. 28, 2006

(51) Int. Cl.
*H03K 19/20*    (2006.01)
*H03K 19/094*   (2006.01)
*H03K 19/00*    (2006.01)
*H03K 19/096*   (2006.01)

(52) U.S. Cl. .................. 326/121; 326/93; 326/95; 326/96; 326/98; 326/112; 327/208; 327/210; 327/211; 327/212; 327/224; 327/225

(58) Field of Classification Search .......... 326/95, 326/98
See application file for complete search history.

(56) References Cited

U.S. PATENT DOCUMENTS 5,831,451 A * 11/1998 Bosshart ................. 326/93

| 6,255,854 | B1 * | 7/2001 | Houston ................ | 326/98 |
| 6,522,171 | B2 * | 2/2003 | Hanson et al. .......... | 326/95 |
| 6,580,293 | B1 * | 6/2003 | Bernstein et al. ........ | 326/95 |
| 6,650,145 | B2 * | 11/2003 | Ngo et al. ............. | 326/98 |
| 6,952,118 | B2 * | 10/2005 | Jamshidi et al. ......... | 326/98 |
| 6,989,706 | B2 * | 1/2006 | Sekigawa et al. ....... | 327/434 |
| 7,112,997 | B1 * | 9/2006 | Liang et al. ........... | 326/81 |
| 2003/0067017 | A1 * | 4/2003 | Leong et al. ........... | 257/206 |
| 2003/0141899 | A1 * | 7/2003 | Tzartzanis et al. ....... | 326/81 |
| 2004/0008056 | A1 * | 1/2004 | Kursun et al. .......... | 326/96 |
| 2004/0095161 | A1 * | 5/2004 | Campbell .............. | 326/98 |
| 2006/0214695 | A1 * | 9/2006 | Lih et al. .............. | 326/98 |

OTHER PUBLICATIONS

Alvandpour, et al. "A Conditional Keeper Technique for Sub-0.13 nm Wide Dynamic Gates," *Microprocessor Research Labs, Intel Corporation*, 2001, pp. 29, 30, no month.

(Continued)

*Primary Examiner*—Rexford Barnie
*Assistant Examiner*—Dylan White
(74) *Attorney, Agent, or Firm*—Winstead PC

(57) ABSTRACT

A dynamic logic gate has a dynamic node pre-charged in response to a pre-charge phase of a clock signal and a logic tree with a plurality of logic inputs for evaluating the dynamic node during an evaluate phase of the clock signal in response to a Boolean combination of the logic inputs. The logic tree has a stacked configuration with at least one multi-gate FEAT device for coupling an intermediate node of the logic tree to the dynamic node in response to a first logic input of the plurality of logic inputs or in response to the pre-charge phase of the clock signal. The multi-gate FEAT device has one gate coupled to the first logic input and a second gate coupled to a complement of the clock signal used to pre-charge the dynamic node.

14 Claims, 6 Drawing Sheets

OTHER PUBLICATIONS

Chiang, Meng-Hsueh et al. "Novel High-Density Low-Power High-Performance Double-Gate Logic Techniques," *IBM T.J. Watson Research Center*, 2004, pp. 122, 123, no month.

Kim, C.H., et al. "A Process Variation Compensating Technique for Sub-90 nm Dynamic Circuits," *Dept. of ECE, Purdue University and Circuit Research, Intel Labs*, 2003, pp. 205, 206, no month.

\* cited by examiner

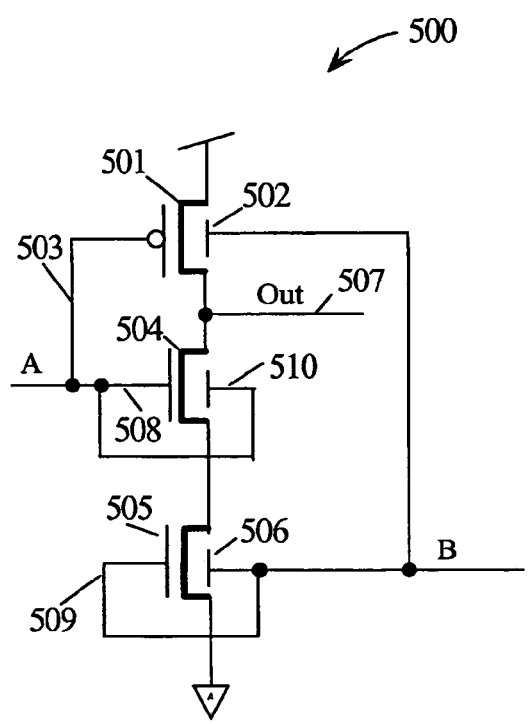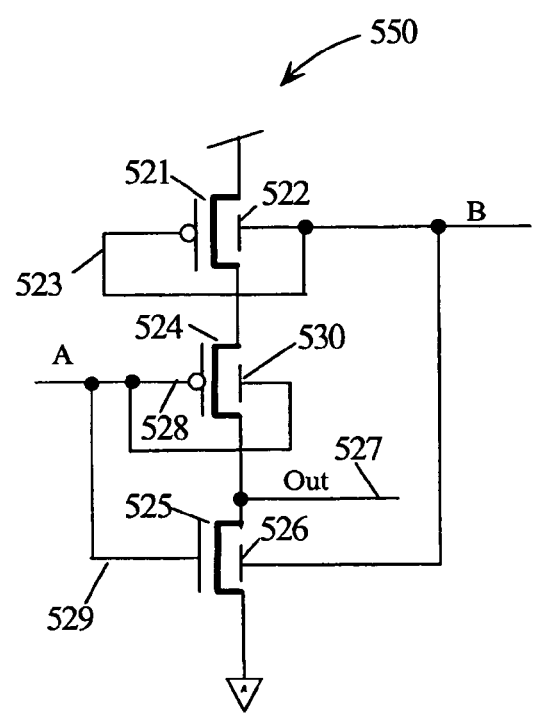
FIG. 3A
(Prior Art)
FIG. 3B
(Prior Art)

INDEPENDENT GATE CONTROL LOGIC CIRCUITRY

GOVERNMENT RIGHTS

This invention was made with Government support under PERCS II, NBCH3039004, BGR W0132280. THE GOVERNMENT HAS CERTAIN RIGHTS IN THIS INVENTION.

TECHNICAL FIELD

The present invention relates in general to metal oxide silicon (MOS) dynamic logic circuits and in particular to dynamic logic circuits using MOS devices.

BACKGROUND INFORMATION

Modern data processing systems may perform Boolean operations on a set of signals using dynamic logic circuits. Dynamic logic circuits are clocked. During the precharge phase of the clock, the circuit is preconditioned, typically by precharging an internal node (dynamic node) of the circuit by coupling to a power supply rail. During an evaluate phase of the clock, the Boolean function being implemented by the logic circuit is evaluated in response to the set of input signal values appearing on the inputs during the evaluate phase. (For the purposes herein, it suffices to assume that the input signals have settled to their "steady-state" values for the current clock cycle, recognizing that the input value may change from clock cycle to clock cycle.) Such dynamic logic may have advantages in both speed and the area consumed on the chip over static logic. However, the switching of the output node with the toggling of the phase of the clock, each cycle may consume power even when the logical value of the input is otherwise unchanged.

This may be appreciated by referring to FIG. 1 illustrating an exemplary two-input NAND dynamic logic gate. Dynamic logic 100 includes two inputs A and B coupled to a corresponding gate of N channel field effect transistors (NFETs) 101-102. During an evaluate phase (logic one) of clock 104, NFET 106 is turned ON, and if any of inputs A or B are a logic one, dynamic node 108 is pulled low (logic zero), and OUT transitions to a logic one via inverter 110. During the precharge phase (logic zero) of Clk 104, dynamic node 108 is precharged to a logic one via P channel field effect transistor (PFET) 112. Half-latch PFET 114 maintains the charge on dynamic node 108 through the evaluate phase unless both of inputs A and B are turned ON. Consequently, dynamic node 108 undergoes two discharge-precharge cycles. OUT similarly undergoes two discharge-precharge cycles, albeit with opposite phase. Because OUT is discharged during the precharge phase of dynamic node 108, even though the Boolean value of the logical function is "true", the dynamic logic gate dissipates power even when the input signal states are unchanged. The NAND configuration of dynamic logic gate 100 forms and intermediate node 103 between NFETs 101 and 102. If both logic inputs A and B are a logic zero during the pre-charge phase then the dynamic node 108 "sees" only the capacitance of that node, however, if after the pre-charge phase input A transitions to a logic one then intermediate node 103 is coupled to the dynamic node 108. Thus, additional capacitance is added to the dynamic node which may cause it to droop do to load sharing. Logic trees in dynamic logic gates generally form intermediate nodes such as 103 which may similarly affect the dynamic node after the pre-charge phase.

Dynamic logic may use a footer NFET 106 or not. In the case the footer NFET 106 is not used, the inputs A and B must be timed to be valid during the evaluate phase of Clk 104. Regardless, dynamic circuits rely on the ability to pre-charge the dynamic node to a logic one state in advance of having valid logic inputs valid. In logic circuitry with a wide input fan-in, there are many parallel paths that may be coupled to the dynamic node by one or more select devices, leakage current may make it difficult to hold the logic state on the dynamic node until the start of the next evaluation cycle. This is especially true as device size decreases.

The sharp increase of leakage currents in scaled technologies severely limits the robustness of dynamic circuits, especially for high fan-in wide dynamic gates, commonly employed in the performance critical units of high-performance microprocessors. A strong keeper is necessary in the pre-charged state or after the completion of evaluation to compensate for the larger leakage current and to hold the right state at the dynamic node. Charge sharing is another major concern in dynamic circuits, which causes voltage drooped on the dynamic node, thus degrading the noise margins. A commonly used circuit technique to prevent the charge sharing effect consists of pre-charging the intermediate node (in the stack configuration) to Vdd during the pre-charge phase with a separate FEAT device. While the technique is quite effective, the intermediate node pre-charging device adds capacitance to the intermediate node (thus degrading its effectiveness in preventing charge sharing and circuit performance) and increases the circuit area.

There is, therefore, a need for a dynamic logic circuit design that adds minimum capacitance on the dynamic node while allowing intermediate nodes to be pre-charged along with the dynamic node.

SUMMARY OF THE INVENTION

Dynamic logic circuits have one or more stacked logic trees that have intermediate nodes that are coupled to the dynamic node by a logic device wherein the stacked logic trees have at least in part a NAND functionality. A particular logic tree evaluates the dynamic node when its intermediate node is coupled to the dynamic node. A dual gate FEAT device is used as the device that couples the intermediate node to the dynamic node, one gate is driven by the normal logic signal and the other is driven by the complement of the pre-charge clock signal. During the pre-charge period, the complement footer pre-charge clock turns ON the second gate and pre-charges the intermediate node of the logic tree at the same time as the dynamic node. During the evaluation period, the logic device couples the intermediate node to the dynamic node. If the dynamic node evaluates to a logic one, then the pre-charging of the intermediate node prevents droop of the dynamic node due to charge sharing in the logic tree. Independent use of the front and back gate of a dual gate FEAT device reduces capacitance on the dynamic node and the intermediate node. In this manner the same logic device is also used for pre-charging the intermediate node.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 3A is a circuit diagram of a NAND logic gate implemented using dual gated FEAT devices;

FIG. 3B is a circuit diagram of a NOR logic gate implemented using dual gated FEAT devices.

DETAILED DESCRIPTION

Figure 1:
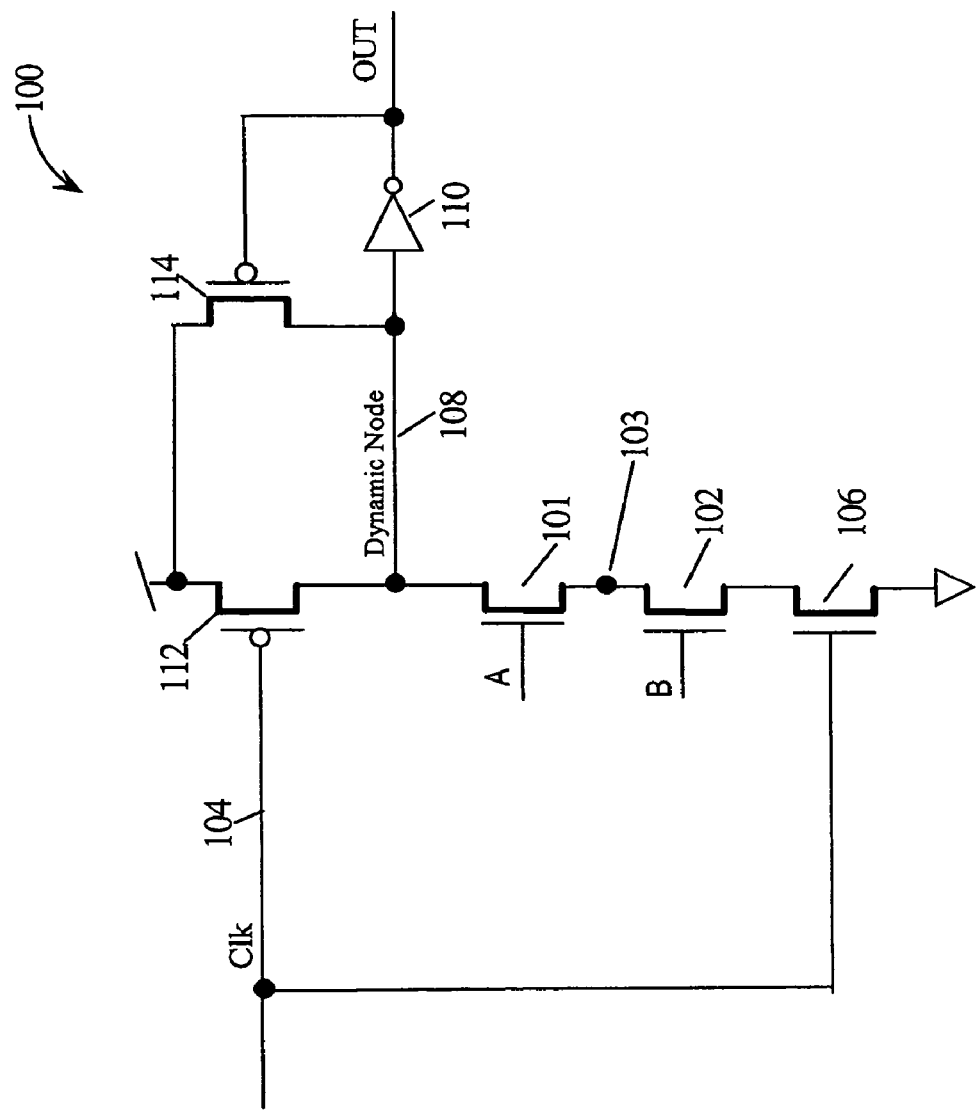
FIG. 1 illustrates, in schematic form, a dynamic logic gate which may be used in conjunction with the present invention.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, data formats within communication protocols, and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Dual or double gate FEAT devices have been described in the literature. Two references are included in the following which explain differing architectures of dual gated FEAT devices including symmetrical and asymmetrical structures. These references explain details of these devices and the size and thus capacitance reduction that results from using a dual gated FEAT device in place of two single gate FEAT devices in appropriate applications. The reader is referred to "Double-Gate CMOS: Symmetrical-Gate Versus Asymmetrical-Gate Devices" IEEE Transactions on Electron Devices, Vol. 48, NO. 2, February 2001 and "Novel High-Density Low-Power High-Performance Double-Gate Logic Techniques", IEEE International SOI Conference, 2004.

The separate, independent biasing of the front and back gate in double gate devices has been exploited to reduce the number transistors required for implementing logic functions to improve the performance, power and area of the circuits. Prior art, however, is limited to the "logic" transistors, and not the "keeper" or intermediate node pre-charging device in the dynamic gate.

FIG. 3A is a circuit diagram of a two input NAND logic gate implemented using three dual gate FEAT devices 501, 504, and 505. Normally a two input NAND logic gate requires two PFET devices and two NFET devices using single gate FEAT devices. Dual gate PFET 501 is turned ON when either its front gate 503, coupled to input A, or its back gate 502, coupled to input B, is a logic zero. Dual gate NFET 504 has its front gate 508 and back gate 510 tied together and coupled to input A, and is turned ON when input A is a logic one. Dual gate NFET 505 has its front gate 509 and back gate 506 tied together and coupled to input B, and is turned ON when input B is a logic one. Output 507, therefore, is pulled low when input A and input B are a both logic one generating the logic NAND function.

FIG. 3B is a circuit diagram of a two input NOR logic gate 550 implemented using three dual gate FEAT devices 521, 524, and 525. Normally a two input NOR logic gate requires two PFET devices and two NFET devices using single gate FEAT devices. Dual gate PFET 521 has its front gate 523 and back gate 522 tied together and coupled to input B, and is turned ON when input B is a logic zero. Dual gate PFET 524 has its front gate 528 and back gate 530 tied together and coupled to input A, and is turned ON when input A is a logic zero. Dual gate NFET 525 is turned ON when either its front gate 529, coupled to input A, or its back gate 526, coupled to input B, is a logic one. Output 527, therefore, is pulled low when input A or input B is a logic one generating the logic NOR function.

FIGS. 3A and 3B represent prior art circuits where a single dual gate FEAT device (e.g., dual gate PFET 501) with independent control of the front gate and back gate serves as two parallel "logic" FETs in a conventional complementary metal oxide silicon (CMOS) logic gate.

Figure 2A:
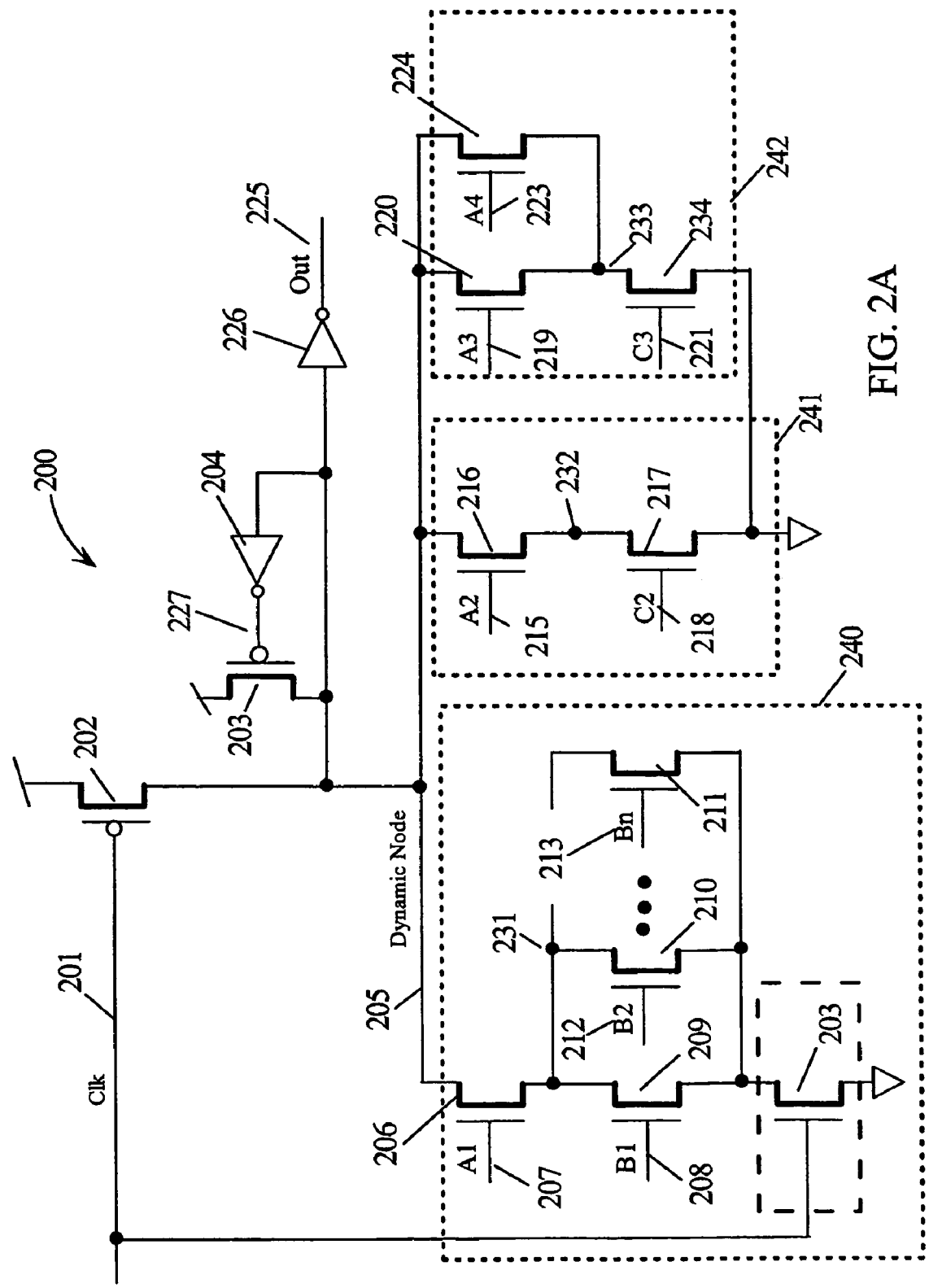
FIG. 2A is a circuit schematic of a dynamic logic gate with multiple stacked logic trees coupled to the dynamic node.

FIG. 2A is a dynamic logic gate 200 illustrating multiple logic trees coupled to a dynamic node 205. Clk 201 is a clock signal having a logic one evaluate cycle and a logic zero pre-charge cycle. Logic tree 240 has an optional footer device 203 used to control the timing of evaluation of logic inputs A1 207, B1 208, B2 212, Bn 213. Logic tree 240 contains a basic NAND functionality and pulls dynamic node 205 to a logic zero if A1 207 is a logic one AND any of the input B1 208, B2 212 through Bn 213 is a logic one. Node 231 is termed an intermediate node and is coupled to dynamic node 205 any time input A1 207 is a logic one. If node 231 has a large number of parallel devices (e.g., B1 208, B2 212, . . . through Bn 213) then the leakage of the parallel paths may cause node 231 to have a large leakage current. Logic tree 240 is an exemplary logic structure to illustrate how an intermediate node may be formed. One may observe that the parallel structure (B1 208, B2 212, . . . through Bn 213) could be interchanged with A1 207 thereby moving node 231 to the dynamic node and alleviating the problem. While this is true, the general problem occurs when two series parallel paths of devices result in a high leakage intermediate node.

Logic tree 241 forms intermediate node 232 with the series connection of NFETs 216 and 217 and pulls dynamic node 205 to a logic zero if both inputs A2 215 and C2 218 are a logic one. Logic tree 242 illustrates two parallel NFETs 220 and 224 coupled to dynamic node 205 and intermediate node 233. Again, logic tree 242 pulls dynamic node 205 to a logic zero if either input A3 219 or A4 223 AND input C3 221 are a logic one. Logic tree 242 illustrates the case where there are two parallel paths coupling dynamic node 205 to an intermediate node (233). In this illustration, only one pull down device (234) is shown, however, in general intermediate node 233 may have a large number of parallel devices for pulling intermediate node 233 to a logic zero in response to logic inputs (e.g., input C3 221). A half latch is formed by PFET 203 and inverter 204 for holding the state of dynamic node 205 after completion of evaluation. Inverter 226 is a static gate that generates Out 225 which has the same logic state as node 227 driving the gate of PFET 203.

Figure 2B:
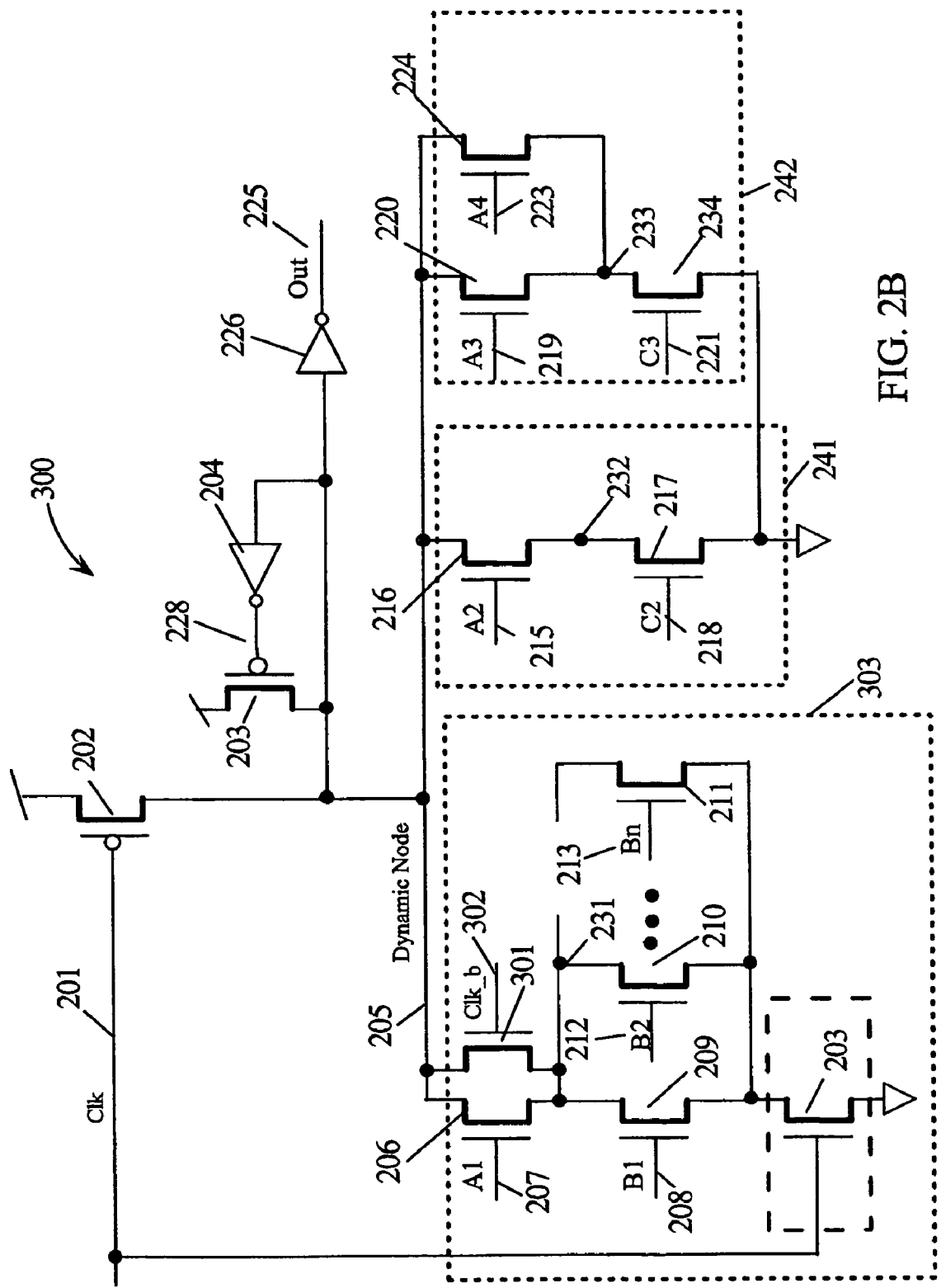
FIG. 2B is a circuit of a dynamic logic gate using a conventional logic device to pre-charge an intermediate node.

FIG. 2B is a dynamic logic gate 300 illustrating multiple logic trees 303, 241, and 242 coupled to a dynamic node 205. Clk 201 is a clock signal having a logic one evaluate cycle and a logic zero pre-charge cycle. Logic tree 303 has an optional footer device 203 used to control the timing of evaluation of logic inputs A1 207, B1 208, B2 212, Bn 213. Logic tree 240 contains a basic NAND functionality and pulls dynamic node 205 to a logic zero if A1 207 is a logic one AND any of the input B1 208, B2 212 through Bn 213 is a logic one. If node 231 has a large number of parallel devices (e.g., B1 208, B2 212 . . . through Bn 213) then the leakage of the parallel paths may cause node 231 to have a large leakage current. An NFET 301 is coupled to the intermediate node 231 in parallel to NFET 206 and is turned ON during the pre-charge cycle of Clk 201 so that intermediate node 231 may be pre-charged at the same time dynamic node 205 is pre-charged. This prevents charge sharing from causing dynamic node 205 to droop when input A1 207 turns ON NFET 206 during the evaluate cycle of Clk 201. This technique, while effective, adds capacitance to the intermediate node with NFET 301, increases the circuit area, and degrades the effectiveness of NFET 301 in preventing charge sharing and circuit performance.

As with FIG. 2A, logic tree 241 in FIG. 2B forms intermediate node 232 with the series connection of NFETs 216 and 217 and pulls dynamic node 205 to a logic zero if both inputs A2 215 and C2 218 are a logic one. Logic tree 242 illustrates two parallel NFETs 220 and 224 coupled to dynamic node 205 and intermediate node 233. Again, logic tree 242 pulls dynamic node 205 to a logic zero if either input A3 219 OR A4 223 AND input C3 221 are a logic one. Logic tree 242 illustrates the case where there are two parallel paths coupling dynamic node 205 to an intermediate node (233). In this illustration, only one pull down device (234) is shown, however, in general intermediate node 233 may have a large number of parallel devices for pulling intermediate node 233 to a logic zero in response to logic inputs (e.g., input C3 221). A half latch is formed by PFET 203 and inverter 204 for holding the state of dynamic node 205 after completion of evaluation. Inverter 226 is a static gate that generates Out 225 which has the same logic state as node 228 driving the gate of PFET 203.

Figure 2C:
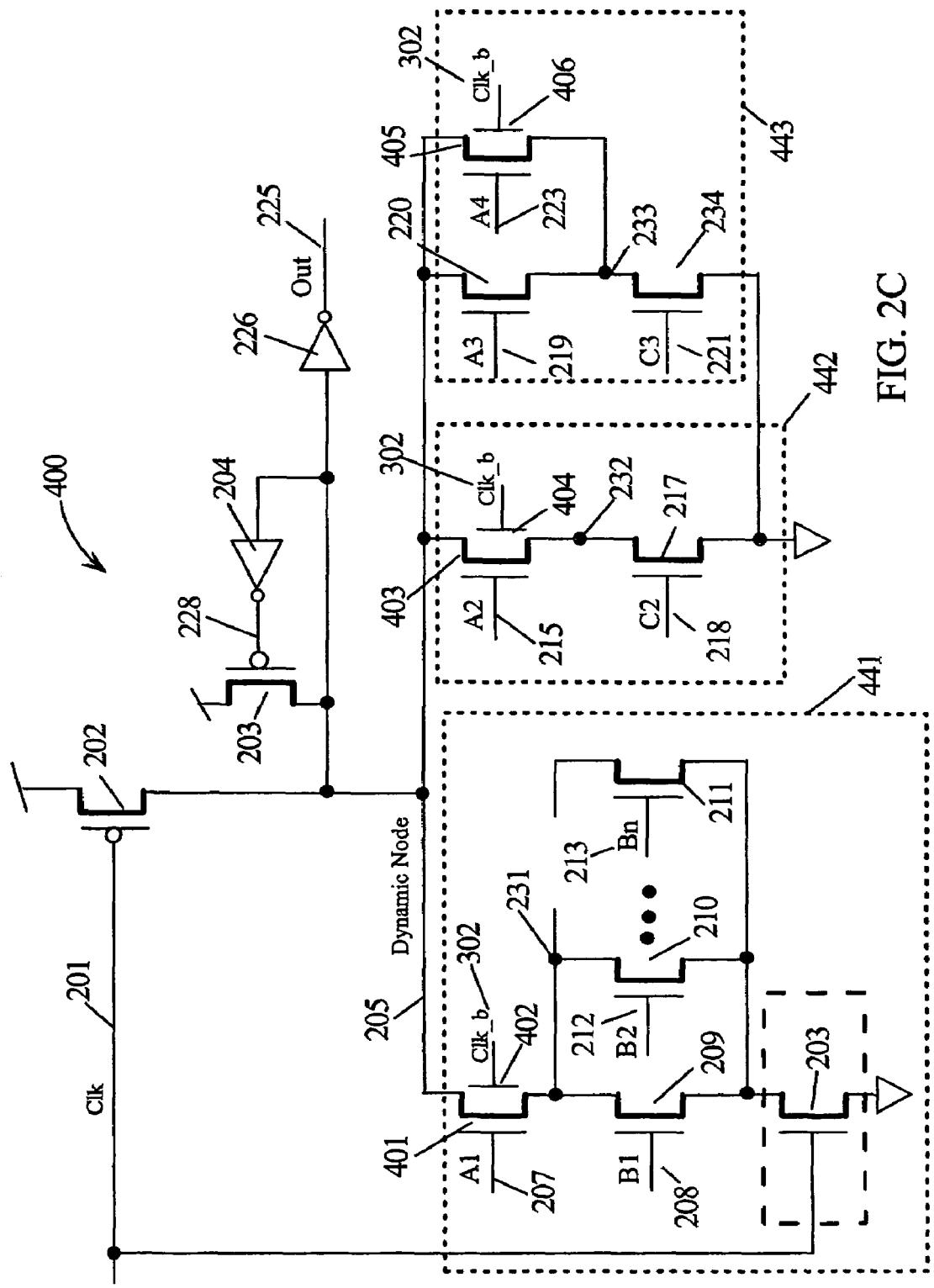
FIG. 2C is a circuit schematic of a dynamic logic gate with multiple stacked logic trees coupled to the dynamic node using a dual gate FEAT device according to embodiments of the present invention.

FIG. 2C is a dynamic logic gate 400 according to embodiments of the present invention illustrating multiple logic trees 441, 442, and 443 coupled to a dynamic node 205. Clk 201 is a clock signal having a logic one evaluate cycle and a logic zero pre-charge cycle. Clk_b 302 is the logic complement of Clk 201. Logic tree 441 has an optional footer device 203 used to control the timing of evaluation of logic inputs A1 207, B1 208, B2 212, Bn 213. Logic tree 440 contains a basic NAND functionality and pulls dynamic node 205 to a logic zero if A1 207 is a logic one AND any of the input B1 208, B2 212 through Bn 213 is a logic one. If node 231 has a large number of parallel devices (e.g., B1 208, B2 212, . . . through Bn 213), then the leakage of the parallel paths may cause node 231 to have a large leakage current. In this embodiment, a dual gate NFET 401 couples the intermediate node 231 to the dynamic node 205, one gate (front gate) is driven by the normal logic signal A1 207 and the other gate (back gate) 402 is driven by the complement of the pre-charge clock signal Clk_b 302. The back gate is turned ON during the pre-charge cycle of Clk 201 by Clk_b 302 so that so that intermediate node 231 is pre-charged at the same time dynamic node 205 is pre-charged. This prevents charge sharing from causing dynamic node 205 to droop when input A1 207 turns ON the front gate of dual gate NFET 401 during the evaluate cycle of Clk 201. Since the logic device (front gate of dual gate NFET 401) and the pre-charge device for the intermediate node (back gate of dual gate NFET 401) are the same device, the capacitance added to intermediate node 231 is greatly reduced allowing this technique to be used to reduce the charge sharing effect more effectively, minimize the added capacitance, circuit area, and performance penalty.

Notice that in a double-gate technology, all other logic transistors (e.g. NFET 209, 210, 211) can either have their front gates tied to their respective back gates (similar to dual gate NFET 505 in FIG. 3A), or have independent controlled parallel front gates and back gates to perform the logic OR function (similar to dual gate NFET 525 in FIG. 3B).

Notice also that in a technology that offers both single gate devices and double gate devices, only dual gate NFET 401 needs to be a double gate device to implement the present invention.

Logic tree 442 forms intermediate node 232 with the series connection of dual gate NFET 403 and NFET 217. Dynamic node 205 is pulled to a logic zero if both inputs A2 215 and C2 218 are a logic one. In this embodiment, a dual gate NFET 403 couples the intermediate node 232 to the dynamic node 205, one gate (front gate) is driven by the normal logic signal A2 215 and the other gate (back gate) 404 is driven by the complement of the pre-charge clock signal Clk_b 302. The back gate is turned ON during the pre-charge cycle of Clk 201 by Clk_b 302 so that so that intermediate node 232 is pre-charged at the same time dynamic node 205 is pre-charged. This prevents charge sharing from causing dynamic node 205 to droop when input A2 215 turns ON the front gate of dual gate NFET 403 during the evaluate cycle of Clk 201.

Logic tree 443 illustrates two parallel NFETs, NFET 220 and dual gate NFET 405 coupled to dynamic node 205 and intermediate node 233. Logic tree 443 pulls dynamic node 205 to a logic zero if either input A3 219 OR A4 223 AND input C3 221 are a logic one. Logic tree 443 illustrates the case where there are two parallel paths coupling dynamic node 205 to an intermediate node (233). In this illustration, only one pull down device (234) is shown, however, in general intermediate node 233 may have a large number of parallel devices for pulling intermediate node 233 to a logic zero in response to logic inputs (e.g., input C3 221). In this case, only one of the devices coupling dynamic node 205 to intermediate node 233 needs be a dual gate FEAT device (e.g., 405) and have its back gate 406 used for pre-charging intermediate node 233 during the pre-charge of dynamic node 205. A half latch is formed by PFET 203 and inverter 204 for holding the state of dynamic node 205 after completion of evaluation. Inverter 226 is a static gate that generates Out 225 which has the same logic state as node 228 driving the gate of PFET 203.

Figure 4:
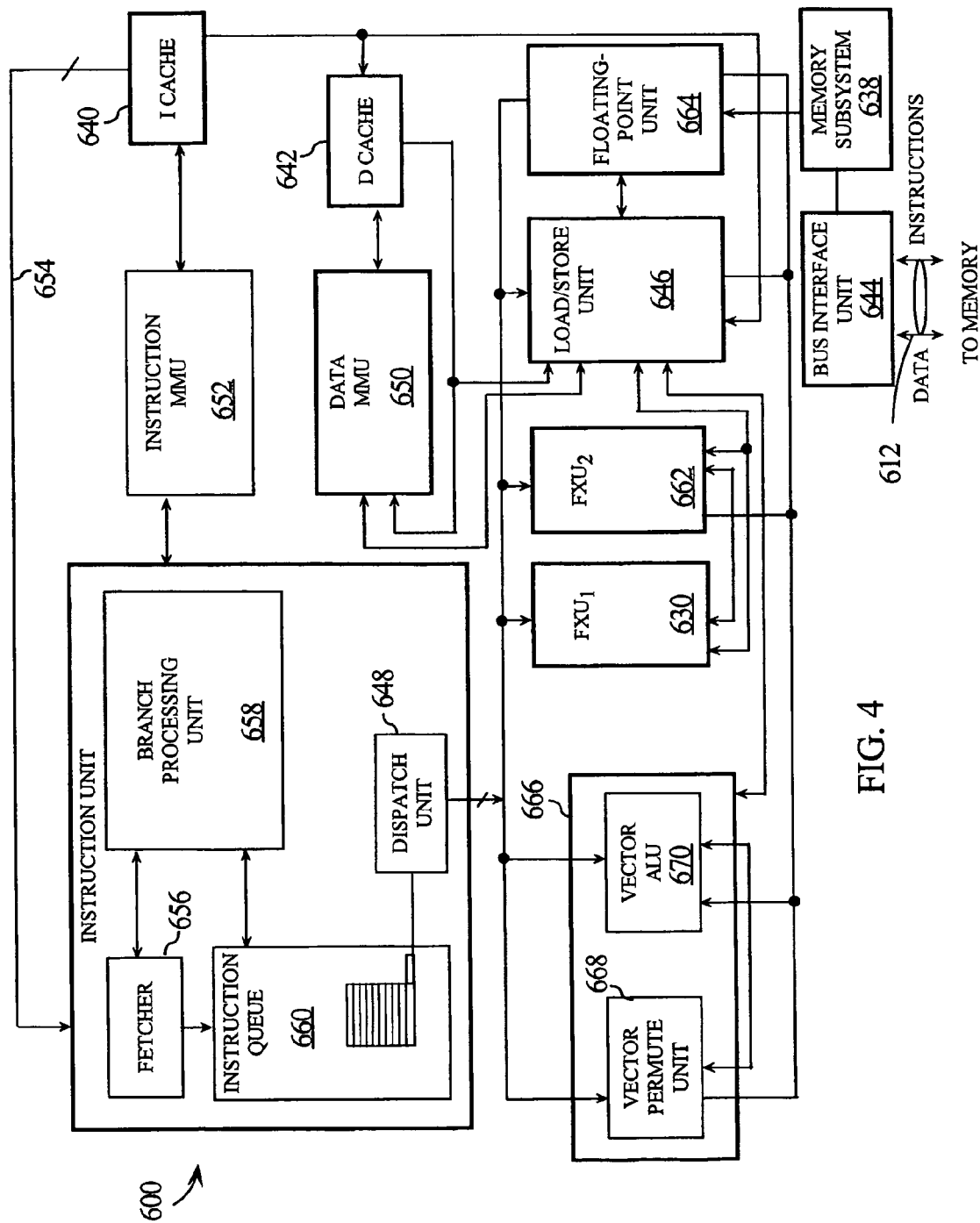
FIG. 4 illustrates a high level block diagram of selected operational blocks within a central processing unit (CPU) incorporating the present inventive principles

FIG. 4 is a high level functional block diagram of selected operational blocks that may be included in a central processing unit (CPU) 600. In the illustrated embodiment, CPU 600 includes internal instruction cache (I-cache) 640 and data cache (D-cache) 642 which are accessible to memory (not shown in FIG. 4) through bus 612, bus interface unit 644, memory subsystem 638, load/store unit 646 and corresponding memory management units: data MMU 650 and instruction MMU 652. In the depicted architecture, CPU 600 operates on data in response to instructions retrieved from I-cache 640 through instruction dispatch unit 648. Dispatch unit 648 may be included in instruction unit 654 which may also incorporate fetch unit 656 and branch processing unit 658 which controls instruction branching. An instruction queue 660 may interface fetch unit 656 and dispatch unit 648. In response to dispatched instructions, data retrieved from D-cache 642 by load/store unit 646 can be operated upon by one of fixed point unit (FXU) 630, FXU 662 or floating point execution unit (FPU) 664. Additionally, CPU 600 provides for parallel processing of multiple data items via vector execution unit (VXU) 666. VXU 666 includes vector permute unit 668 which performs permutation operations on vector operands, and vector arithmetic logic unit (VALU) 670 which performs vector arithmetic operations, which may include both fixed-point and floating-point operations on vector operands. VALU 670 may be implemented using dynamic logic gates 400 in accordance with the present inventive principles. Other units may also employ dynamic logic gates 400 according to embodiments of the present invention.

Although the present invention and its advantages have been described in detail, it should be understood that various changes, substitutions and alterations can be made herein without departing from the spirit and scope of the invention as defined by the appended claims.

What is claimed is:

1. A dynamic logic circuit having a clock input coupled to a clock signal, a plurality of logic inputs and a logic output comprising:
    a dynamic node pre-charged in response to a pre-charge phase of the clock signal;
    a logic tree for evaluating the dynamic node in response to a Boolean combination of the plurality of logic inputs and an evaluate phase of the clock signal; and
    a multi-gate FET device coupling an intermediate node of the logic tree to the dynamic node in response to a logic state on a first logic input of the plurality of logic inputs or during the pre-charge phase of the clock;
    wherein the multi-gate FET device is a dual gate NFET having a front gate terminal coupled to the first logic input of the plurality of logic inputs and a back gate terminal coupled to a logic complement of the clock signal, a drain terminal coupled to the dynamic node, and a source terminal coupled to the intermediate node of the logic tree; and
    wherein the dual gate NFET is an asymmetrical device and the back gate turns ON the dual gate NFET with a first conductivity, the front gate turns ON the dual gate NFET with a second conductivity and the second conductivity is greater than the first conductivity.

2. The dynamic logic circuit of claim 1 further comprising a static logic circuit having an input coupled to the dynamic node and an output generating the logic output of the dynamic logic gate.

3. The dynamic logic circuit of claim 1, wherein the dynamic node is coupled to a first voltage potential of a power supply in response to the pre-charge phase of the clock signal and decoupled from the first voltage potential in response to the evaluate phase of the clock signal.

4. The dynamic logic circuit of claim 3, wherein the dynamic node is coupled to the first voltage potential of the power supply with a PFET having a source coupled to the first voltage potential of the power supply, a drain coupled to the dynamic node, and a gate coupled to the clock signal.

5. The dynamic logic circuit of claim 2, wherein the static logic circuit is a logic inverter having an input coupled to the dynamic node and an output generating the logic output of the dynamic logic circuit.

6. The dynamic logic circuit of claim 1, wherein the second conductivity is substantially equal to the first conductivity.

7. The dynamic logic circuit of claim 1, further comprising a keeper circuit for enhancing a logic one state of the dynamic node during the pre-charge phase of the clock signal.

8. A data processing system comprising:
    a central processing unit (CPU); and
    a memory operable for communicating instructions and operand data to the CPU, wherein the CPU includes one or more dynamic logic gates each having a dynamic node pre-charged in response to a pre-charge phase of the clock signal, a logic tree for evaluating the dynamic node in response to a Boolean combination of the plurality of logic inputs and an evaluate phase of the clock signal thereby generating a logic output of the dynamic logic gate, and a multi-gate FEAT device coupling an intermediate node of the logic tree to the dynamic node in response to a logic state on a first logic input of the plurality of logic inputs or during the pre-charge phase of the clock;
    wherein the multi-gate FEAT device is a dual gate NEET having a front gate terminal coupled to the first logic input of the plurality of logic inputs and a back nate terminal coupled to a logic complement of the clock signal, a drain terminal coupled to the dynamic node, and a source terminal coupled to the intermediate node of the logic tree; and
    wherein the dual gate NFET is an asymmetrical device and the back gate turns ON the dual gate NFET with a first conductivity, the front gate turns ON the dual gate NFET with a second conductivity and the second conductivity is greater than the first conductivity.

9. The data processing system of claim 8 further comprising a static logic circuit having an input coupled to the dynamic node and an output generating the logic output of the dynamic logic gate.

10. The data processing system of claim 8, wherein the dynamic node is coupled to a first voltage potential of a power supply in response to the pre-charge phase of the clock signal and decoupled from the first voltage potential in response to the evaluate phase of the clock signal.

11. The data processing system of claim 10, wherein the dynamic node is coupled to the first voltage potential of the power supply with a PFET having a source coupled to the first voltage potential of the power supply, a drain coupled to the dynamic node, and a gate coupled to the clock signal.

12. The data processing system of claim 9, wherein the static logic circuit is a logic inverter having an input coupled to the dynamic node and an output generating the logic output of the dynamic logic circuit.

13. The dynamic logic circuit of claim 8, wherein the second conductivity is substantially equal to the first conductivity.

14. The dynamic logic circuit of claim 8, further comprising a keeper circuit for enhancing a logic one state of the dynamic node during the pre-charge phase of the clock signal.

* * * * *